United States Patent
Kim et al.

(10) Patent No.: US 8,117,740 B2
(45) Date of Patent: Feb. 21, 2012

(54) METHOD AND APPARATUS FOR MANUFACTURING A PROBE CARD

(75) Inventors: Ki-Joon Kim, Seoul (KR); Yong-Hwi Jo, Bucheon-si (KR); Sung-Young Oh, Suwon-si (KR); Jun-Tae Hwang, Seoul (KR)

(73) Assignee: Phicom Corporation, Seoul (KR)

( * ) Notice: Subject to any disclaimer, the term of this patent is extended or adjusted under 35 U.S.C. 154(b) by 1045 days.

(21) Appl. No.: 11/996,413

(22) PCT Filed: Jul. 24, 2006

(86) PCT No.: PCT/KR2006/002906
§ 371 (c)(1),
(2), (4) Date: Jan. 22, 2008

(87) PCT Pub. No.: WO2007/021079
PCT Pub. Date: Feb. 22, 2007

(65) Prior Publication Data
US 2008/0209720 A1    Sep. 4, 2008

(30) Foreign Application Priority Data
Aug. 12, 2005   (KR) .................. 10-2005-0074337

(51) Int. Cl.
*G01R 3/00* (2006.01)
*B23P 19/00* (2006.01)
(52) U.S. Cl. ............ 29/739; 29/743; 29/709; 29/701; 29/714; 29/760; 29/834; 29/836
(58) Field of Classification Search .......... 29/739, 29/743, 709, 701, 714, 760, 834, 836
See application file for complete search history.

(56) References Cited

U.S. PATENT DOCUMENTS

| | | | | |
|---|---|---|---|---|
| 4,193,317 A * | 3/1980 | Oono et al. | ............... | 74/479.01 |
| 4,610,442 A * | 9/1986 | Oku et al. | ............... | 269/73 |
| 4,932,883 A * | 6/1990 | Hsia et al. | ............... | 439/66 |
| 5,180,975 A * | 1/1993 | Andoh et al. | ............... | 324/537 |
| 5,214,963 A * | 6/1993 | Widder | ............... | 73/827 |
| 5,399,505 A * | 3/1995 | Dasse et al. | ............... | 438/17 |
| 5,445,554 A * | 8/1995 | Hosokawa | ............... | 451/11 |
| 5,504,369 A * | 4/1996 | Dasse et al. | ............... | 257/620 |
| 5,523,941 A * | 6/1996 | Burton et al. | ............... | 700/60 |

(Continued)

FOREIGN PATENT DOCUMENTS

JP    07-063787    3/1995

(Continued)

OTHER PUBLICATIONS

PCT/KR2006/002906 PCT International Search Report dated Aug. 12, 2005.

(Continued)

*Primary Examiner* — Derris Banks
*Assistant Examiner* — Kaying Kue
(74) *Attorney, Agent, or Firm* — Daly, Crowley, Mofford & Durkee, LLP

(57) ABSTRACT

In a method of manufacturing a probe card, a plurality of probe modules, including a sacrificial substrate and probes on the sacrificial substrate, is prepared. The probe modules are mutually aligned to form a probe module assembly having the aligned probe modules and a desired size. The probe module assembly is then attached to a probe substrate. Thus, the probe card having a large size may be manufactured.

8 Claims, 6 Drawing Sheets

U.S. PATENT DOCUMENTS

| | | | | |
|---|---|---|---|---|
| 5,660,381 | A * | 8/1997 | Suzuki | 269/73 |
| 5,836,080 | A * | 11/1998 | Inagaki et al. | 33/1 M |
| 6,346,034 | B1 * | 2/2002 | Leng | 451/58 |
| 6,413,839 | B1 * | 7/2002 | Brown et al. | 438/463 |
| 6,575,444 | B1 * | 6/2003 | Bidaud | 269/91 |
| 6,622,586 | B2 * | 9/2003 | Scheidegger et al. | 74/490.08 |
| 6,624,648 | B2 * | 9/2003 | Eldridge et al. | 324/756.03 |
| 6,637,737 | B1 * | 10/2003 | Beecherl et al. | 269/71 |
| 6,768,542 | B2 * | 7/2004 | Ise et al. | 356/237.2 |
| 6,873,087 | B1 * | 3/2005 | Choi et al. | 310/323.17 |
| 6,902,990 | B2 * | 6/2005 | Gottfried et al. | 438/463 |
| 7,513,857 | B2 * | 4/2009 | Gueller et al. | 483/16 |
| 7,557,904 | B2 * | 7/2009 | Ohmiya et al. | 355/72 |
| 7,841,071 | B2 * | 11/2010 | Jeserer | 29/739 |
| 7,900,896 | B2 * | 3/2011 | Fujita | 269/58 |
| 2007/0023136 | A1 * | 2/2007 | Priewasser | 156/272.8 |
| 2008/0193646 | A1 * | 8/2008 | Suzuki et al. | 427/255.28 |
| 2009/0004828 | A1 * | 1/2009 | Kobayashi | 438/463 |
| 2009/0026676 | A1 * | 1/2009 | Kurita et al. | 269/21 |

FOREIGN PATENT DOCUMENTS

| | | |
|---|---|---|
| JP | 11-142436 | 5/1999 |
| JP | 2001-168156 | 6/2001 |
| JP | 2001-281268 | 10/2001 |
| JP | 2003-215161 | 1/2002 |
| JP | 2002-141379 | 5/2002 |
| JP | 2003-506667 | 2/2003 |
| JP | 2004-186670 | 7/2004 |
| KR | 1020010093028 A | 10/2001 |

OTHER PUBLICATIONS

Japanese Office Action dated Jul. 6, 2010 for corresponding Japanese Patent Application No. 2008-524883, 4 pages.

* cited by examiner

[Fig. 1]
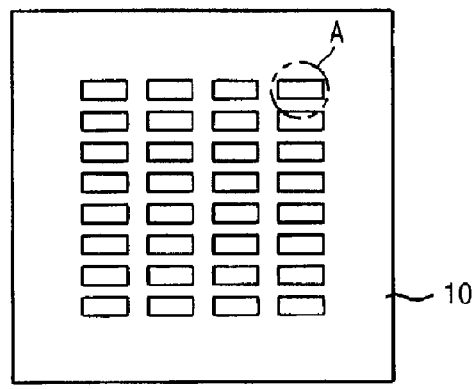
[Fig. 2]
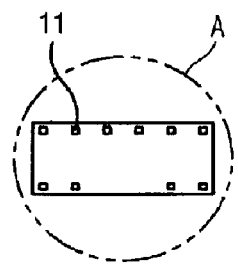
[Fig. 3]
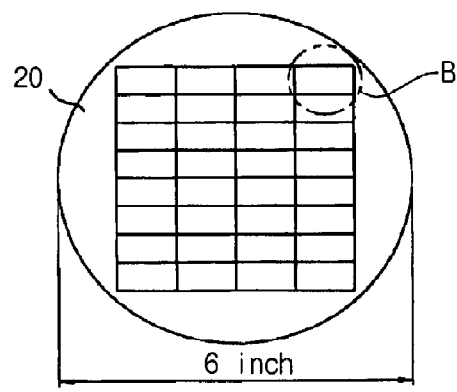
[Fig. 4]
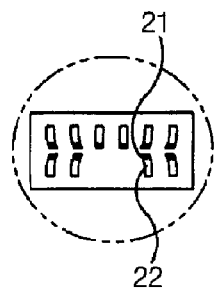

[Fig. 5]
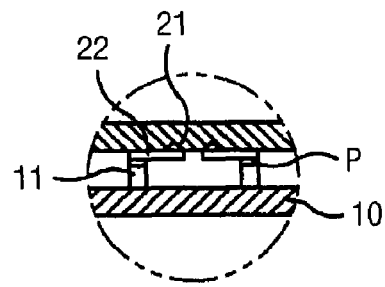
[Fig. 6]
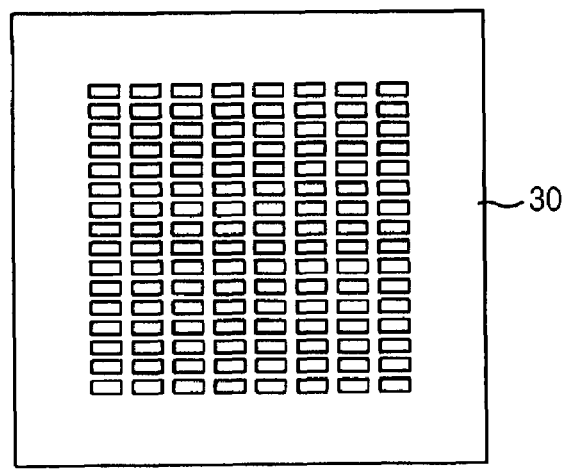
[Fig. 7]
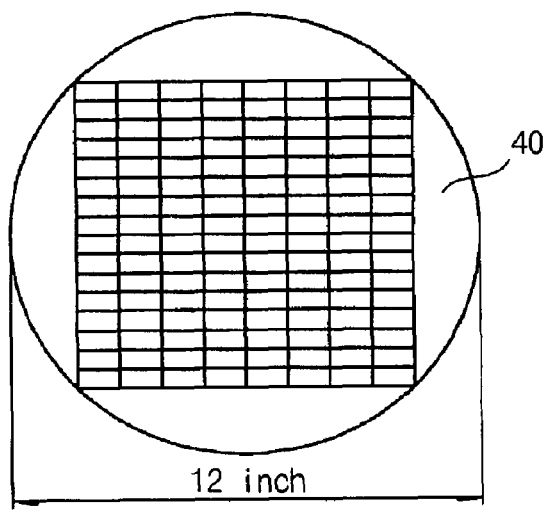

[Fig. 8]
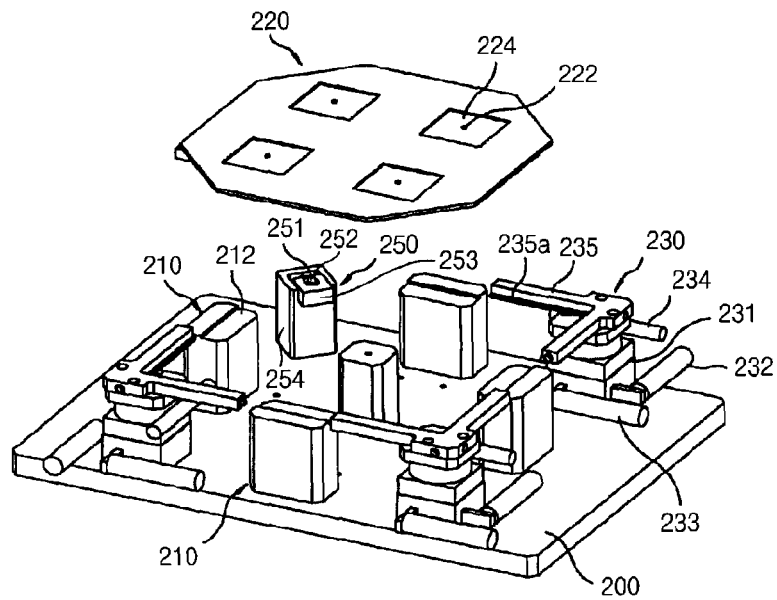
[Fig. 9]
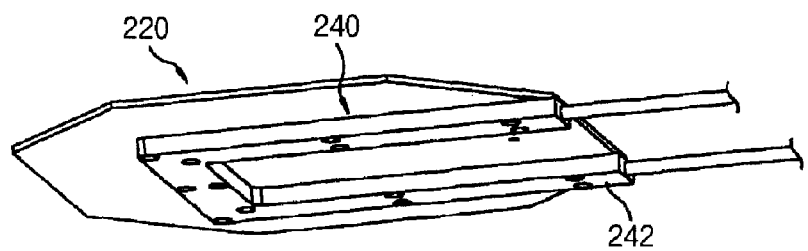
[Fig. 10]
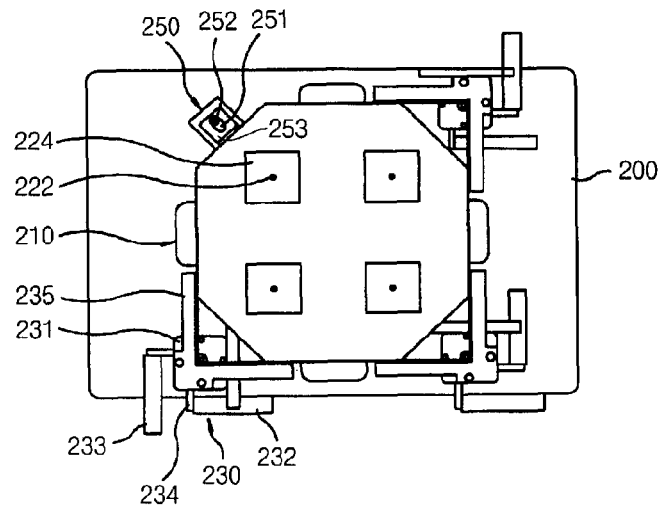

[Fig. 11]
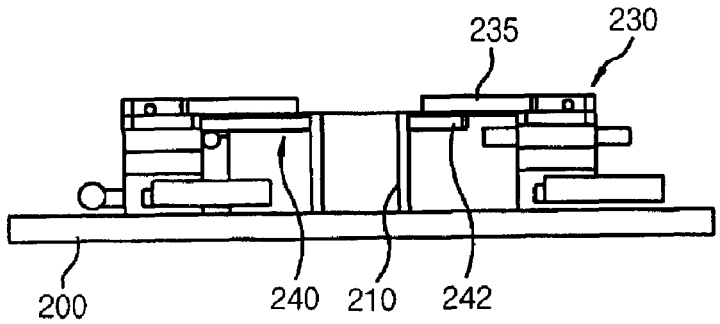
[Fig. 12]
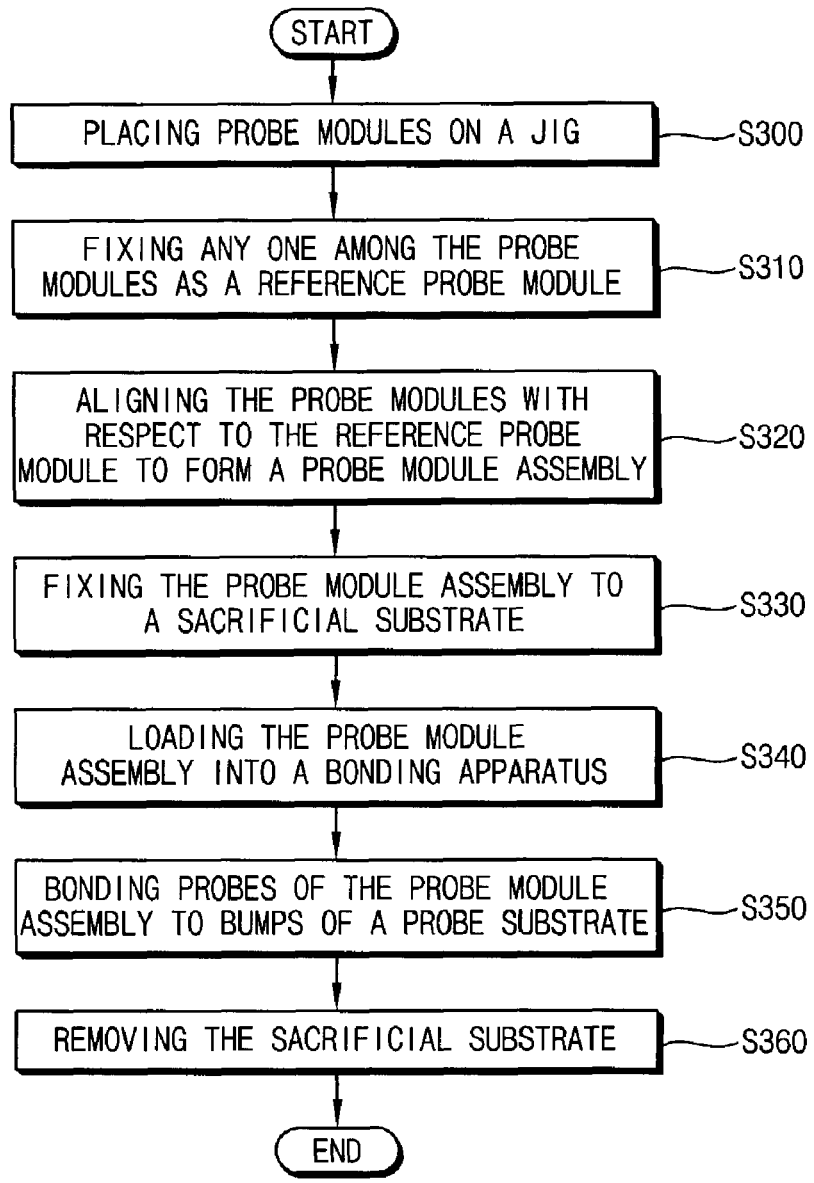

[Fig. 13]
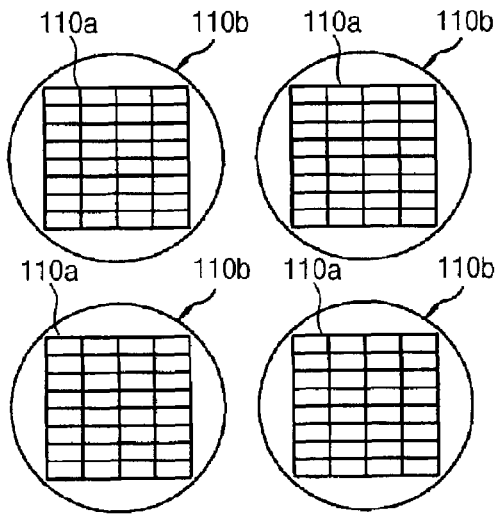
[Fig. 14]
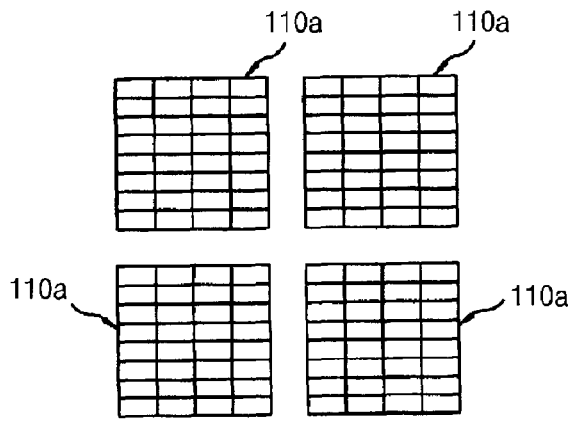
[Fig. 15]
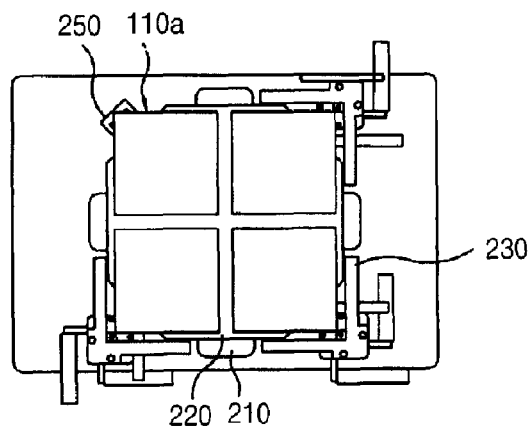

[Fig. 16]
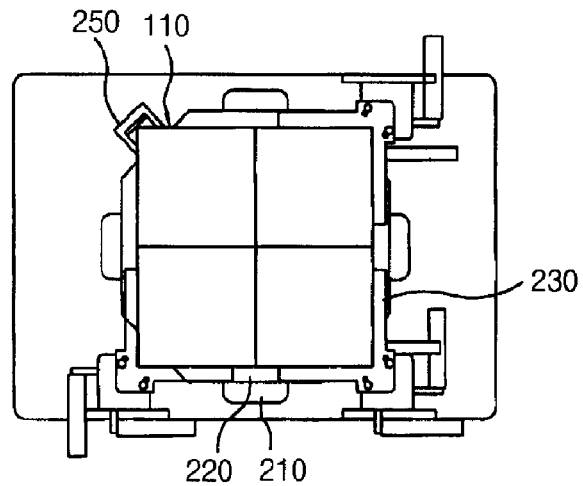
[Fig. 17]
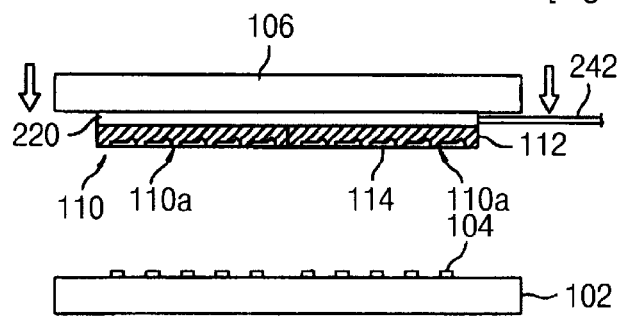
[Fig. 18]
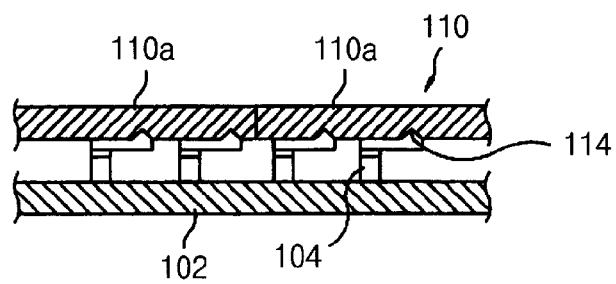
[Fig. 19]
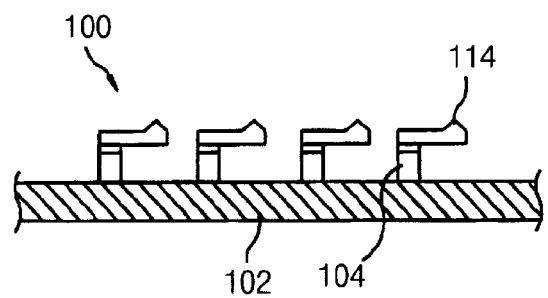

METHOD AND APPARATUS FOR MANUFACTURING A PROBE CARD

TECHNICAL FIELD

Example embodiments of the present invention relate to a method of manufacturing a probe card and an apparatus for performing the same. More particularly, example embodiments of the present invention relate to a method of manufacturing a probe card having a desired size that corresponds to a large size of a probe substrate by using probe modules, and an apparatus for performing the method.

BACKGROUND ART

In general, to manufacture a semiconductor device, various unit processes including an exposure process, an ion implantation process, a chemical vapor deposition (CVD) process, an etching process, a cleaning process, etc., are repeatedly carried out on a semiconductor substrate to form a plurality of chips on the semiconductor substrate. Here, abnormal chips may be formed on the semiconductor substrate due to defects generated in the unit processes. Detections of the abnormal chips before sawing the semiconductor substrate, to form a plurality of semiconductor packages, may be advantageous in view of a yield and costs of manufacturing the semiconductor device.

Therefore, to determine whether the chips are normal or not, an electrical die sorting (EDS) process using a probing system is performed on the chips to test electrical characteristics of the chips. In the EDS process, probes make contact with contact pads on the chips. Test currents are applied to the contact pads through the probes. Electrical characteristics corresponding to outputted currents from the contact pads are compared to data in the probing system to determine whether the chips are normal or not.

A conventional cantilever type probe card includes a plurality of probe modules having a 4-by-8 chip arrangement in length and breadth, i.e., a (4×8=32) devices under test (32 DUTs), in accordance with a chip arrangement of an electronic device as an object.

A conventional method of manufacturing a probe card is illustrated with reference to FIGS. 1 to 5.

Referring to FIGS. 1 and 2, bumps 11 corresponding to pads on an object, such as an electronic device, are formed on a probe substrate 10.

Referring to FIGS. 3 and 4, a 6-inch probe module assembly 20, including probe tips 21 and supporting beams 22, is prepared. Here, the bumps 11, the probe tips 21 and the supporting beams 22 may be formed by a photolithography process and a plating process, etc.

Referring to FIG. 5, a solder paste P is coated on the bumps 11. The supporting beams 22 then make contact with the bumps 11, respectively. The bumps 11 and the supporting beams 22 are heated to a temperature of about 200° C. to about 350° C. to melt the solder paste P, thereby attaching the bumps 11 to the supporting beams 22, respectively. The probe module assembly 20 is then removed by an etching process to complete a conventional probe card.

Here, as semiconductor technologies have been rapidly developed, more chips are formed on a single semiconductor substrate to curtail costs of manufacturing a semiconductor device and to improve a yield of a semiconductor device. Thus, to test the chips, a probe card becomes larger. That is, as shown in FIGS. 6 and 7, a conventional probe card is manufactured using a 12-inch probe module assembly 40 to correspond the probe card to a probe substrate 30 that has an 8-by-16 chip arrangement, i.e., 128 DUTs.

When the DUTs of the probe substrate are increased from 32 to 128 or more, it is required to change the 6-inch probe module assembly into the 12-inch probe module assembly. Thus, compatibility of the conventional probe module assembly, in accordance with sizes of the probe substrates, may be reduced. That is, in the conventional method of manufacturing a probe card, the probe module assembly, having a large size that corresponds to that of the probe substrate, may be used.

Moreover, an apparatus for manufacturing a probe card is replaced with a new one suitable for manufacturing the probe module assembly having the large size. As a result, a time and costs for replacing the apparatus may be remarkably increased.

Further, it is required to use a large semiconductor substrate in proportion to the large size of the probe substrate. However, the large semiconductor substrate has poor flatness compared to that of a small semiconductor substrate so that a yield of the semiconductor device may be greatly reduced.

Furthermore, when at least one probe defect is generated on the semiconductor substrate, the probe defect is considered as a defect of a process for forming a probe card. Therefore, the probe defect with respect to the probes on the large semiconductor substrate may be higher than that with respect to the probes on the small semiconductor substrate.

DISCLOSURE OF INVENTION

Technical Problem

Example embodiments of the present invention provide a method of manufacturing a probe card that has a size corresponding to that of a probe substrate, and improved compatibility and flatness.

Example embodiments of the present invention also provide an apparatus for performing the above-mentioned method.

Technical Solution

In a method of manufacturing a probe card in accordance with one aspect of the present invention, a plurality of probe modules, including a sacrificial substrate and probes on the sacrificial substrate, is prepared. The probe modules are mutually aligned to form a probe module assembly having the aligned probe modules and a desired size. The probe module assembly is then attached to a probe substrate.

In a method of manufacturing a probe card in accordance with another aspect of the present invention, a plurality of probe modules, including a sacrificial substrate and probes on the sacrificial substrate, is prepared. The probe modules are placed on a jig. The probe modules on the jig are mutually aligned to locate the probe modules at desired positions. The aligned probe modules are then fixed. The fixed probe modules are loaded into a bonding chamber. The probes of the probe modules are bonded to bumps of a probe substrate.

An apparatus for manufacturing a probe card in accordance with still another aspect of the present invention includes a base plate, a jig, a fixing plate, an aligning unit, and a fixing unit. The jig is placed on the base plate. The fixing plate is detachably positioned on the jig. The aligning unit mutually aligns probe modules on the fixing plate. The fixing unit fixes the aligned probe modules to the fixing plate.

Advantageous Effects

According to the present invention, a plurality of the probe modules is independently formed. The probe modules are mutually aligned and fixed to form the probe module assembly. The probe module assembly is simultaneously bonded to the bumps of the probe substrate. Thus, the probe card having a large size may be manufactured using the method and the apparatus of the present invention.

BRIEF DESCRIPTION OF THE DRAWINGS

The above and other features and advantages of the invention will become readily apparent by reference to the following detailed description when considered in conjunction with the accompanying drawings wherein:

FIG. 1 is a plan view illustrating a 6-inch conventional probe substrate;

FIG. 2 is an enlarged plan view of the portion A in FIG. 1;

FIG. 3 is a plan view illustrating a 6-inch conventional probe module assembly;

FIG. 4 is an enlarged plan view of the portion B in FIG. 3;

FIG. 5 is a cross-sectional view illustrating an attachment structure between bumps of the probe substrate in FIG. 1 and supporting beams of the probe module assembly in FIG. 3;

FIG. 6 is a plan view illustrating a 12-inch conventional probe substrate;

FIG. 7 is a plan view illustrating a 12-inch conventional probe module assembly;

FIG. 8 is an exploded perspective view illustrating an apparatus for manufacturing a probe card in accordance with an example embodiment of the present invention;

FIG. 9 is a perspective view illustrating the fixing plate in FIG. 8;

FIG. 10 is a plan view illustrating the apparatus in FIG. 8;

FIG. 11 is a side view illustrating the apparatus in FIG. 8;

FIG. 12 is a flow chart illustrating a method of manufacturing a probe card in accordance with an example embodiment of the present invention;

FIG. 13 is a plan view illustrating probe modules on a sacrificial substrate in accordance with an example embodiment of the present invention;

FIG. 14 is a plan view illustrating the probe modules from which the sacrificial substrate in FIG. 13 is removed;

FIGS. 15 and 16 are plan views illustrating processes for aligning the probe modules; and FIGS. 17 to 19 are cross-sectional views illustrating processes for attaching a probe module assembly to the probe substrate.

BEST MODE FOR CARRYING OUT THE INVENTION

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 8 is an exploded perspective view illustrating an apparatus for manufacturing a probe card in accordance with an example embodiment of the present invention, FIG. 9 is a perspective view illustrating the fixing plate in FIG. 8, FIG. 10 is a plan view illustrating the apparatus in FIG. 8, FIG. 11 is a side view illustrating the apparatus in FIG. 8, FIG. 12 is a flow chart illustrating a method of manufacturing a probe card in accordance with an example embodiment of the present invention, FIG. 13 is a plan view illustrating probe modules on a sacrificial substrate in accordance with an example embodiment of the present invention, FIG. 14 is a plan view illustrating the probe modules from which the sacrificial substrate in FIG. 13 is removed, FIGS. 15 and 16 are plan views illustrating processes for aligning the probe modules, and FIGS. 17 to 19 are cross-sectional views illustrating processes for attaching a probe module assembly to the probe substrate.

Hereinafter, principal features of a method in accordance with this example embodiment of the present invention are illustrated in detail.

Referring to FIGS. 17 to 19, a probe card 100 is manufactured using the method of this example embodiment. Here, the probe card 100 is provided to a tester (not shown) of a probing system (not shown). The probe card 100 tests chips on a semiconductor substrate to determine whether the chips are normal or not. The probe card 100 includes a plurality of probes 114 making contact with contact pads of the chips, respectively.

Particularly, in the method of this example embodiment, probe modules 110a are separately formed. The probe modules 110 are aligned and fixed to form a probe module assembly that has a size corresponding to that of a probe substrate 102. The probe module assembly 110 is attached to the probe substrate 102 to complete the probe card 100. Here, the probe substrate 102 may include a space transformer or a printed circuit board.

Specifically, to manufacture the probe card 100, the probes 114 are formed on a small sacrificial substrate 112, such as a 6-inch silicon wafer, using a microelectro-mechanical system (MEMS).

The sacrificial substrate 112 is cut using a dicing saw to form at least two probe modules 110a. Here, the probe modules 110a may have various sizes and shapes such as a polygonal shape or a circular shape.

The probe modules 110a are mutually aligned. The aligned probe modules 110a are then fixed to form the probe module assembly 110 having a desired size.

The probes 114 of the probe module assembly 110 are bonded to bumps 104 on the probe substrate 102 to complete the probe card 100.

Hereinafter, an apparatus for manufacturing the probe module assembly 110 having the desired size is illustrated in detail with reference to FIGS. 8 to 11.

Referring to FIGS. 8 to 11, the apparatus includes a base plate 200, a jig 210 placed over the base plate 200, a fixing plate 220 detachably placed on the jig 210, an aligning unit 230 for mutually aligning the probe modules 110a on the fixing plate 220, and a fixing unit 240 for fixing the probe modules 110a to an upper face of the fixing plate 220.

Here, in this example embodiment, the base plate 200 may have a rectangular metal plate. The jig 210 is mounted on the base plate 200.

The jig 210 may include two pairs of parts. Further, two parts of each pair face each other. The jig 210 includes a stepped portion 212 having an "L" shape, on which the fixing plate 220 is detachably placed.

The fixing plate 220 has a single polygonal plate. Vacuum holes 222 are formed through the fixing plate 220. Positions and numbers of the vacuum holes 222 correspond to those of the probe modules 110a.

Vacuum is provided into the vacuum holes 222 from the fixing unit 240 to fix the probe modules 110a. To firmly fix the probe modules 110a, vacuum grooves 224 for receiving the vacuum are formed at a surface portion of the fixing plate 220. That is, the vacuum holes 222 are positioned at a central portion of the vacuum grooves 224, respectively.

Here, in this example embodiment, the fixing plate 220 may include ceramic having a low coefficient of thermal expansion.

The aligning unit 230 includes three parts to mutually align the probe modules 110a on the fixing plate 220. The parts of the aligning unit 230 are arranged at three corners of the base plate 200. The parts of the aligning unit 230 are upwardly exposed through corners of the fixing plate 220.

The aligning unit 230 includes a columnar body 231 on the base plate 200. An X-bar 232, a Y-bar 233 and a θ-bar 234 are provided to the body 231. Further, a fixing bar 235 is provided to the body 231. The X-bar moves the fixing bar 235 along a horizontal X-axis direction. The Y-bar moves the fixing bar 235 along a horizontal Y-axis direction substantially perpendicular to the X-axis direction. The θ-bar horizontally rotates the fixing bar 235 with respect to a θ-axis.

Specifically, the X-bar 232, the Y-bar 233, the θ-bar 234 and the fixing bar 235 are interlocked with one another using a mechanical mechanism in the body 231. Each of the fixing bars 235 of aligning unit 230 has an "L" shape having substantially the same length. Further, vacuum holes 235a through which the vacuum passes are formed at an inner face of the fixing bar 235, which faces the probe modules 110a, to firmly secure the probe modules 110a using the vacuum. Here, the vacuum holes 235a are arranged along a lengthwise direction of the fixing bar 235.

The fixing unit 240 pushes the probe modules 110a aligned by the aligning unit 230 toward the fixing plate 220, thereby securing the aligned probe modules 110a to the fixing plate 220. As shown in FIGS. 9 and 11, a vacuum line 242 is arranged beneath the fixing plate 220. The vacuum line 242 is in fluid communication with the vacuum holes 222 of the fixing plate 220 and the vacuum holes 235a of the fixing bar 235, to fix the probe modules 110a.

A pushing unit 250 is arranged at the rest corner of the base plate 200 to push the rest corner of the fixing plate 220.

Particularly, the pushing unit 250 includes a body 254 having a long groove 251, a rod 253 movably inserted in the long groove 251, and a screw 252. The rod 251 of the pushing unit 250 pushes the fixing plate 220 toward the aligning unit 230 so that the fixing plate 220 closely makes contact with the stepped portion 212 of the jig 210. Positions of the pushing unit 250 are selectively fixed using the screw 252 so that the fixing plate 220 is secured to the stepped portion 212 of the jig 210.

Hereinafter, a method of manufacturing a probe card using the above-mentioned apparatus is illustrated in detail.

Referring to FIG. 12, in step S300, the probe modules 110a including a sacrificial substrate is placed on the jig 210.

Here, as shown in FIG. 13, a small sacrificial substrate 110b, such as a 6-inch silicon wafer, is patterned by an MEMS process including a photolithography process, an etching process, a plating process, etc., to form probe modules 110a on the sacrificial substrate 110b. As shown in FIG. 14, the sacrificial substrate 110b is then cut to complete the probe modules 110a. The probe modules 110a may have various sizes and shapes such as a polygonal shape, a circular shape, etc. The cut of the sacrificial substrate 110b may be carried out using a dicing saw.

Each of the probe modules 110a has a small size so that the probe modules 110a may have good flatness. Further, when the probe modules 110a are assembled to form a probe module assembly, the probe module assembly may also have good flatness, although the probe module assembly has a large size. As a result, electrical contact between the probe and the chip may be ensured so that a yield of a semiconductor substrate may be remarkably increased.

Here, it is obvious to persons skilled in the art that the cut of the sacrificial substrate and the formation of the probes on the sacrificial substrate are reversely carried out.

Referring to FIG. 15, the fixing plate 220 is placed on the stepped portions 212 of the jigs 210 that are positioned in four different directions on the base plate 200. The pushing unit 250 pushes the fixing plate 220 toward the aligning unit 230 to secure the fixing plate 220 to the stepped portions 212. The probe modules 110a are sequentially placed on the fixing plate 220 that is located on the jigs 210.

In step S310, any one among the aligned probe modules 110a is fixed as a reference probe module. In step S320, the rest of the probe modules 110a are aligned with respect to the reference probe module to form a probe module assembly 110. In step S330, the probe module assembly 110 is fixed to the fixing plate 220.

Specifically, in step S310, as shown in FIG. 16, the vacuum is applied to a probe module 110a adjacent to the pushing unit 250 to fix the probe module 110a.

Coordinate positions of the probe modules 110a are obtained using a microscope (not shown). The probe modules 110a, except for the reference probe module, are moved to predetermined coordinate positions, which correspond to bumps of a probe substrate, thereby aligning the probe modules 110a.

Here, the X-axis bar 232, the Y-axis bar 233 and the θ-axis bar 234 of the aligning unit 230 align the probe modules 110a on the fixing plate 220 with respect to the reference probe module, thereby forming the probe module assembly 110. Further, the alignment of the probe modules 110a is carried out under conditions in which the vacuum is applied to the probe modules 110a through the vacuum holes 235a of the fixing bar 235. Furthermore, the vacuum is applied to the aligned probe modules 110a on the fixing plate 220 through the vacuum holes 222, which is in fluid communication with the vacuum line 242, to fix the probe modules 110a.

Moreover, in steps S320 and S330, the vacuum groove 224 in which the vacuum hole 222 is positioned functions as to enlarge a contact area of the probe module 110a with respect to the vacuum, thereby firmly securing the probe modules 110a.

Referring to FIG. 17, in step S340, the aligned and fixed probe module assembly 110 is loaded into a bonding apparatus. Here, the fixing plate 220 and the probe module assembly 110 fixed to the fixing plate 220 using the fixing unit 240 are separated from the jig 210. The fixing plate 220 and the probe modules assembly 110 are then loaded into the bonding apparatus. The vacuum line 242 of the fixing unit 240 is transferred together with the fixing plate 220 and the probe module assembly 110 to maintain the fixed state of the probe module assembly 110. Therefore, the vacuum is continuously applied to the probe module assembly 110 during the process in which the fixing plate 220 and the probe module assembly 110 are transferred into the bonding apparatus.

Referring to FIG. 18, in step S350, the probe module assembly 110 is bonded to the probe substrate 102 by a bonding process. Particularly, the sacrificial substrate 112 of the probe module assembly 110 is secured to a chuck. The probes 114 of the probe module assembly 110 are aligned with the bumps 104 of the probe substrate 102. The probes 114 are then bonded to the bumps 104.

Here, all of the probes 114 of the probe module assembly 110 may be simultaneously bonded to the bumps 104 of the probe substrate 102.

Referring to FIG. 19, in step S360, the sacrificial substrate 112 is then removed from the probe module assembly 110 by an etching process to complete the probe card 100.

According to this example embodiment, the probe card having a large area is manufactured without new and additional processes and new equipment.

Further, the probe card may have good flatness so that electrical characteristics of a semiconductor device may be accurately tested using the probe card. As a result, a yield of a test for the semiconductor device may be increased.

Furthermore, a 12-inch or more probe card may be manufactured by simply changing the apparatus and/or increasing the number of the semiconductor substrates.

INDUSTRIAL APPLICABILITY

According to the present invention, a plurality of the probe modules is independently formed. The probe modules are mutually aligned and fixed to form the probe module assembly. The probe module assembly is simultaneously bonded to the bumps of the probe substrate. Thus, the probe card having a large size may be manufactured using the method and the apparatus of the present invention.

Further, although the size of the probe substrate becomes larger, the small probe modules are bonded to the bumps of the probe substrate without new equipment to form the probe module assembly having a desired size. Thus, the compatibility of the probe module assembly may be improved.

Furthermore, the small probe modules have good flatness so that the probe module assembly may have also good flatness. As a result, the electrical contacts between the probes and chips of the semiconductor device may be ensured.

Moreover, a 12-inch or more probe card may be manufactured by simply changing the apparatus and/or increasing the number of the semiconductor substrates.

Having described the preferred embodiments of the present invention, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

The invention claimed is:

1. An apparatus for manufacturing a probe card, comprising:
    a base plate;
    a jig placed on the base plate;
    a fixing plate detachably positioned on the jig;
    an aligning unit for mutually aligning probe modules on the fixing plate; and a fixing unit for fixing the aligned probe modules to the fixing plat;
    wherein the aligning unit comprises:
        a body;
        a fixing bar movably arranged over the body;
        an X-axis bar provided with the body to move the fixing bar along an X-axis direction;
        a Y-axis bar provided with the body to move the fixing bar along a Y-axis direction; and
        a θ-axis bar provided with the body to rotate the fixing bar with respect to a θ-axis, and
    wherein the fixing bar has an "L" shape and vacuum holes for applying vacuum to the probe modules are formed through an inner face of the fixing bar.

2. The apparatus of claim 1, wherein the jig has a stepped portion for supporting the fixing plate.

3. The apparatus of claim 1, wherein the fixing plate has vacuum holes for applying vacuum to the probe modules.

4. The apparatus of claim 3, wherein the fixing plate further comprises a vacuum groove in which the vacuum hole is positioned.

5. The apparatus of claim 1, wherein the aligning unit is arranged at three positions on the base plate corresponding to three corners of the fixing plate.

6. The apparatus of claim 1, wherein the fixing unit comprises a vacuum line placed beneath the fixing plate to apply vacuum to the probe modules.

7. The apparatus of claim 1, further comprising a pushing unit mounted on the base plate to push a corner of the fixing plate toward a central portion of the base plate.

8. The apparatus of claim 7, wherein the pushing unit comprises: a body having a groove; a rod movably inserted in the groove to push the fixing plate; and a screw for selectively fixing positions of the rod in the groove.

* * * * *